US011675144B2

United States Patent
Uchiyama

(10) Patent No.: US 11,675,144 B2
(45) Date of Patent: Jun. 13, 2023

(54) LASER MODULE

(71) Applicant: FUJIKURA LTD., Tokyo (JP)

(72) Inventor: Masahiro Uchiyama, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 16/978,097

(22) PCT Filed: Nov. 28, 2018

(86) PCT No.: PCT/JP2018/043786
§ 371 (c)(1),
(2) Date: Sep. 3, 2020

(87) PCT Pub. No.: WO2019/176181
PCT Pub. Date: Sep. 19, 2019

(65) Prior Publication Data
US 2021/0072468 A1 Mar. 11, 2021

(30) Foreign Application Priority Data
Mar. 13, 2018 (JP) .............................. JP2018-045567

(51) Int. Cl.
*G02B 6/40* (2006.01)
*G02B 6/42* (2006.01)
(Continued)

(52) U.S. Cl.
CPC .............. *G02B 6/4206* (2013.01); *G02B 6/32* (2013.01); *G02B 6/4214* (2013.01);
(Continued)

(58) Field of Classification Search
CPC ......... H01S 5/02251; G02B 6/32; G02B 6/42; G02B 6/40
(Continued)

(56) References Cited

U.S. PATENT DOCUMENTS 8,891,579 B1* 11/2014 Price .................... H01S 5/40
372/50.12
2004/0027631 A1* 2/2004 Nagano ................ G02B 6/4249
372/36
(Continued)

FOREIGN PATENT DOCUMENTS

CN 104583827 A 4/2015
CN 104704410 A 6/2015
(Continued)

OTHER PUBLICATIONS

International Preliminary Report on Patentability issued in corrseponding International Application No. PCT/JP2018/043786 dated Sep. 24, 2020 (14 pages).
(Continued)

*Primary Examiner* — Kaveh C Kianni
(74) *Attorney, Agent, or Firm* — Osha Bergman Watanabe & Burton LLP

(57) ABSTRACT

A laser module, includes: an optical fiber; n laser diodes $LD_i$ (i=1, 2, . . . , n) arranged in an order corresponding to a descending order of optical path lengths $LO_i$ of optical paths respectively extending from the laser diodes $LD_i$ to the optical fiber; and n collimating lenses $SL_i$ respectively disposed in the optical paths to be distant from the respective laser diodes $LD_i$ and from the optical fiber. When a distance from each of the laser diodes $LD_i$ to a corresponding one of the collimating lenses $SL_i$ is defined as a collimation length $LC_i$, at least one of a collimation length $LC_1$ and a collimation length $LC_n$ differs from a certain distance SL that is set with respect to each of the collimating lenses $SL_i$.

10 Claims, 7 Drawing Sheets

(51) Int. Cl.
*H01S 5/02251* (2021.01)
*G02B 6/32* (2006.01)
*H01S 5/40* (2006.01)
*H01S 5/0239* (2021.01)

(52) U.S. Cl.
CPC ........ *H01S 5/0239* (2021.01); *H01S 5/02251* (2021.01); *H01S 5/4012* (2013.01)

(58) Field of Classification Search
USPC .......................................................... 385/15
See application file for complete search history.

(56) References Cited

U.S. PATENT DOCUMENTS

| | | | | |
|---|---|---|---|---|
| 2004/0233964 | A1* | 11/2004 | Yamanaka | G02B 27/0961 372/108 |
| 2005/0018255 | A1* | 1/2005 | Nakaya | B41J 2/465 358/497 |
| 2009/0245315 | A1* | 10/2009 | Faybishenko | G02B 6/4214 372/50.12 |
| 2015/0280404 | A1* | 10/2015 | Kasai | G02B 27/12 359/639 |
| 2016/0181764 | A1* | 6/2016 | Kanskar | H01S 5/02251 372/44.01 |

FOREIGN PATENT DOCUMENTS

| | | | |
|---|---|---|---|
| EP | 3070502 A1 | 9/2016 | |
| JP | 2004064064 A * | 2/2004 | ......... B23K 26/0604 |
| JP | 2013235943 A | 11/2013 | |
| JP | 2014192450 A | 10/2014 | |
| WO | 2014034428 A1 | 3/2014 | |
| WO | 2014103451 A1 | 7/2014 | |
| WO | 2016/117108 A1 | 7/2016 | |
| WO | 2017122792 A1 | 7/2017 | |

OTHER PUBLICATIONS

International Search Report issued in corresponding International Application No. PCT/JP2018/043786 dated Feb. 26, 2019 (2 pages).

* cited by examiner

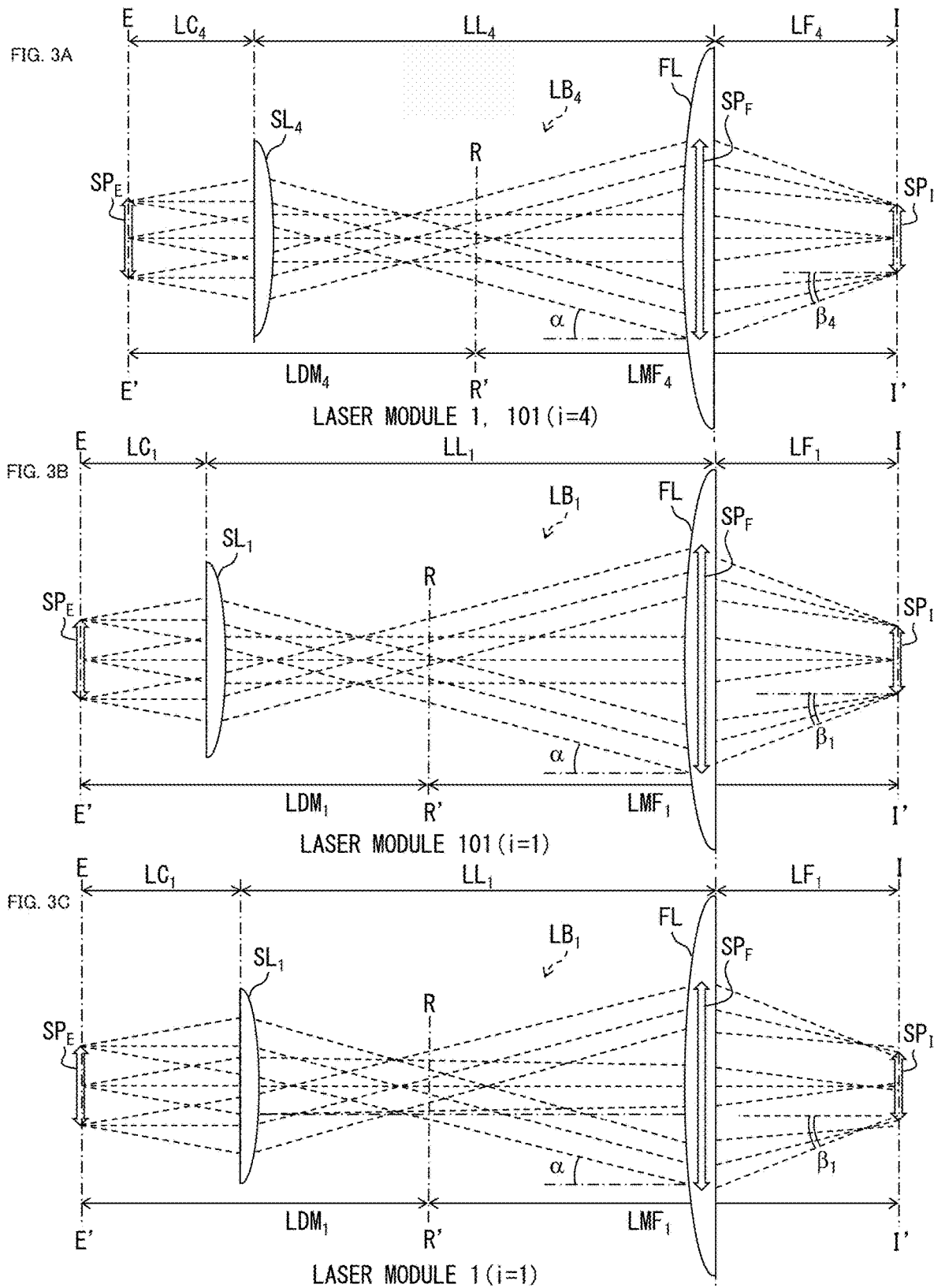

LASER MODULE 101

LASER MODULE 101

LASER MODULE 1

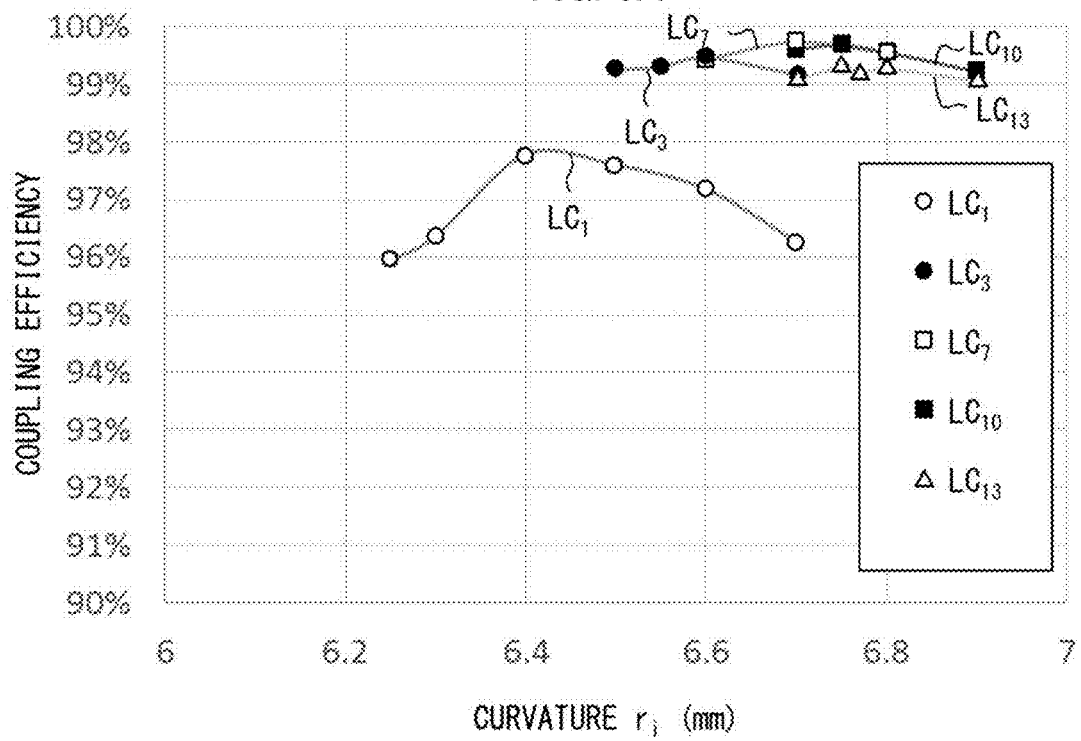
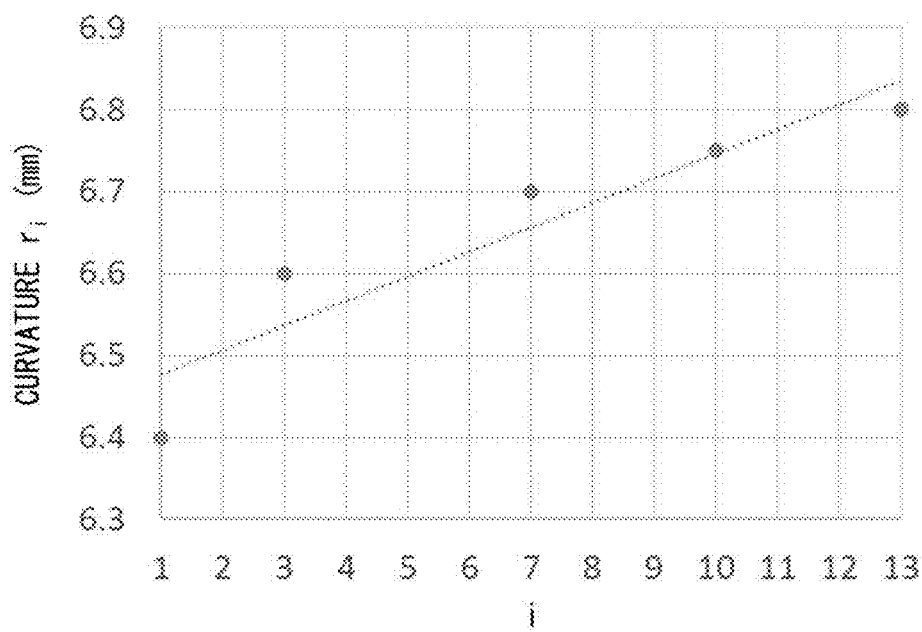

LASER MODULE

TECHNICAL FIELD

The present invention relates to a laser module including a plurality of laser diodes and an optical fiber.

BACKGROUND

A laser module including a plurality of laser diodes and an optical fiber is widely used as an excitation light source of a fiber laser. In such a laser module, laser beams emitted from the plurality of laser diodes are caused to enter the optical fiber. Use of the laser module makes it possible to obtain a high-power laser beam which cannot be obtained from a single laser diode. Typical examples of conventional laser modules encompass a laser module 101 (see Patent Literature 1) illustrated in FIG. 7.

In the laser module 101 illustrated in FIG. 7, laser beams emitted from seven laser diodes LD1 to LD7 are guided to an optical fiber OF by use of seven mirrors M1 to M7. That is, the laser beams emitted from the laser diodes LD1 to LD7 and a laser beam which propagates through the optical fiber OF are optically coupled to each other via these optical components. Then, the laser beam which propagates through the optical fiber OF is emitted from the laser module 101 as an output laser beam. Note that only a chief ray of the laser beam emitted from each of the laser diodes LD1 to LD7 is indicated with a broken line in FIG. 7.

The laser module 101 having the above-described configuration can provide an output laser beam whose power is approximately seven times as strong as a laser beam emitted from each of the laser diodes.

CITATION LIST

[Patent Literature 1]
Japanese Patent Application Publication, Tokukai, No. 2013-235943 (Publication Date: Nov. 21, 2013)

In the conventional laser module 101, the power of an output laser beam depends on the coupling efficiency (the efficiency of coupling which takes place) between the laser beams emitted from the laser diodes LD1 to LD7 and a laser beam which propagates through the optical fiber OF. The higher the coupling efficiency, the higher the power of the output laser beam of the laser module 101. That is, a higher coupling efficiency allows the powers of the laser beams emitted from the laser diodes LD1 to LD7 to be more efficiently converted into the power of the output laser beam. In terms of this coupling efficiency, the conventional laser module 101 has room for improvement.

SUMMARY

One or more embodiments of the present invention provide a laser module which includes a plurality of laser diodes and an optical fiber and has an improved coupling efficiency between laser beams emitted from the laser diodes and a laser beam which propagates through the optical fiber.

A laser module in accordance with one or more embodiments is a laser module, including: an optical fiber; n laser diodes $LD_i$ (i=1, 2, . . . , n) arranged in this order in accordance with a descending order of an optical path length $LO_i$, the optical path length $LO_i$ being a length of an optical path extending from each of the laser diodes $LD_i$ to the optical fiber; and n collimating lenses $SL_i$ provided in the respective optical paths so as to be distant from the respective laser diodes $LD_i$ and from the optical fiber. In the laser module, when a distance from each of the laser diodes $LD_i$ to a corresponding one of the collimating lenses $SL_i$ is defined to be a collimation length $LC_i$, at least one of a collimation length $LC_1$ corresponding to a laser diode $LD_1$ and a collimation length $LC_n$ corresponding to a laser diode $LD_n$ differs from a certain distance SL which is set with respect to each of the collimating lenses $SL_i$.

A laser module in accordance with one or more embodiments is a laser module, including: an optical fiber; n laser diodes $LD_i$ (i=1, 2, . . . , n) arranged in this order in accordance with a descending order of an optical path length $LO_i$, the optical path length $LO_i$ being a length of an optical path extending from each of the laser diodes $LD_i$ to the optical fiber; and n collimating lenses $SL_i$ provided in the respective optical paths so as to be distant from the respective laser diodes $LD_i$ and from the optical fiber. In the laser module, when a curvature of each of the collimating lenses $SL_i$ is defined to be a curvature $r_i$, at least one of a curvature $r_i$ of a collimating lens $SL_i$ corresponding to a laser diode $LD_1$ and a curvature $r_n$ of a collimating lens $SL_n$ corresponding to a laser diode $LD_n$ differs from a curvature of each of the other ones of the collimating lenses $SL_i$.

A laser module in accordance with one or more embodiments is a laser module, including: an optical fiber; n laser diodes $LD_i$ (i=1, 2, . . . , n) arranged in this order in accordance with a descending order of an optical path length $LO_i$, the optical path length $LO_i$ being a length of an optical path extending from each of the laser diodes $LD_i$ to the optical fiber; and n collimating lenses $SL_i$ provided in the respective optical paths so as to be distant from the respective laser diodes $LD_i$ and from the optical fiber. In the laser module, when a size of an emitter included in each of the laser diodes $LD_i$ is defined to be an emitter size $ES_i$, at least one of an emitter size $ES_1$ and an emitter size $ES_n$ differs from an emitter size of each of the other ones of the laser diodes $LD_i$.

A laser module in accordance with one or more embodiments includes a plurality of laser diodes and an optical fiber and has an improved coupling efficiency between laser beams emitted from the laser diodes and a laser beam which propagates through the optical fiber.

BRIEF DESCRIPTION OF DRAWINGS

FIG. 3A is a plan view schematically illustrating a unit optical system in a case of n=4 among unit optical systems included in the laser module illustrated in FIG. 1. FIG. 3B is a plan view schematically illustrating a unit optical system in a case of n=1 among unit optical systems included in a laser module of Comparative Example illustrated in FIG. 7. FIG. 3C is a plan view schematically illustrating a unit optical system in a case of n=1 among the unit optical systems included in the laser module illustrated in FIG. 1.

FIG. 6A is a graph illustrating a correlation between a coupling efficiency and a curvature of an S-axis collimating lens of a unit optical system included in a laser module of Example 2 of the present invention. FIG. 6B is a graph illustrating a curvature for each unit optical system included in the laser module of Example 2 of the present invention.

DETAILED DESCRIPTION

Embodiment 1

(Configuration of Laser Module)

Figure 1:
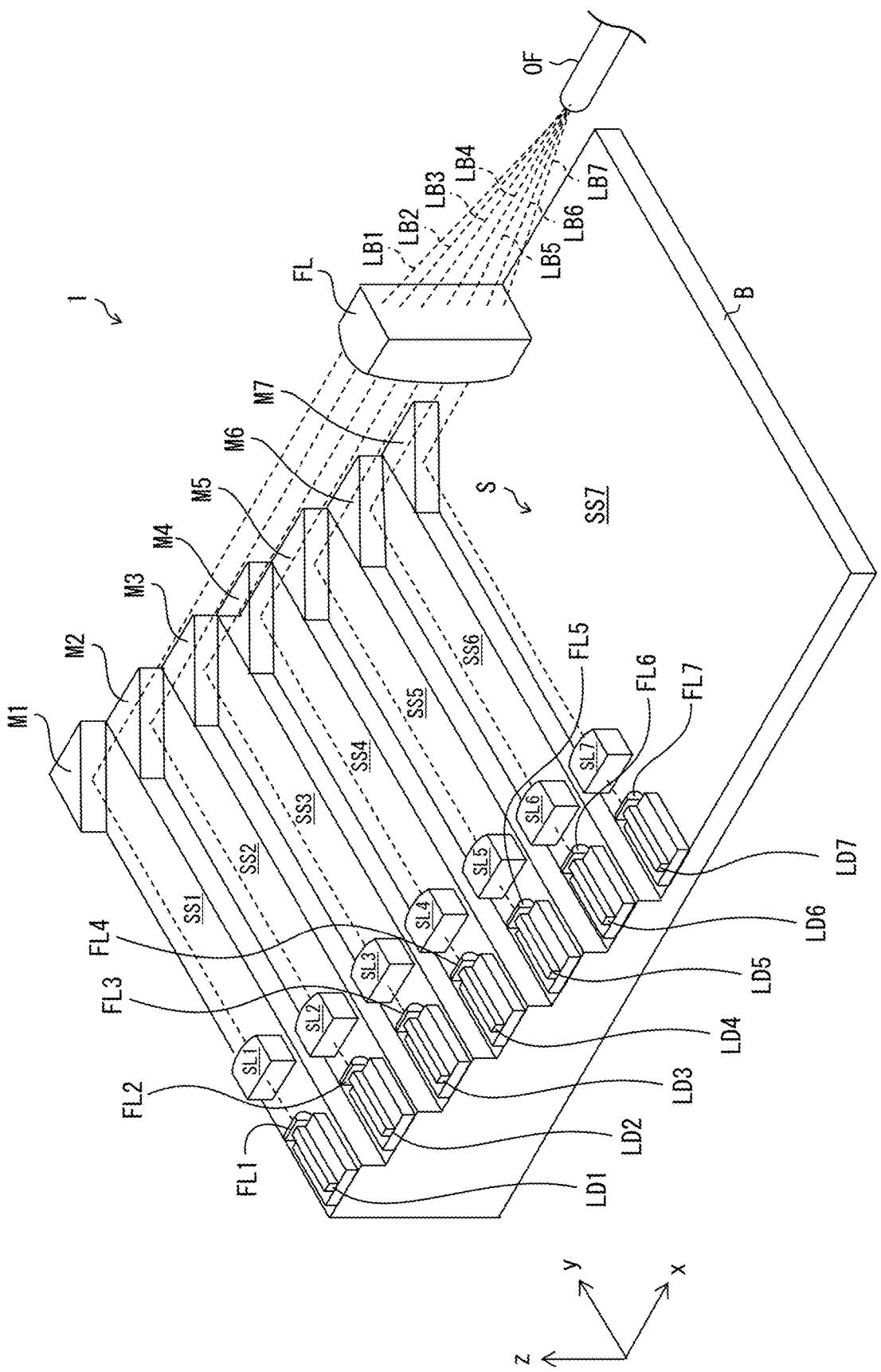
FIG. 1 is a perspective view illustrating a laser module of Embodiment 1 of the present invention.

The following will discuss a configuration of a laser module 1 in accordance with Embodiment 1 of the present invention, with reference to FIG. 1. FIG. 1 is a perspective view illustrating a laser module 1.

The laser module 1 includes seven laser diodes $LD_1$ to $LD_7$, seven F-axis collimating lenses $FL_1$ to $FL_7$, seven S-axis collimating lenses $SL_i$ to $SL_7$, seven mirrors $M_1$ to $M_7$, a condenser lens FL, and an optical fiber OF, as illustrated in FIG. 1. The laser diodes $LD_1$ to $LD_7$, the F-axis collimating lenses $FL_1$ to $FL_7$, the S-axis collimating lenses $SL_1$ to $SL_7$, the mirrors $M_1$ to $M_7$, and the F-axis condenser lens FL are mounted on a bottom plate B of a housing of the laser module 1. The optical fiber OF passes through a side wall of the housing of the laser module 1 such that an end portion including an entrance end surface $OF_I$ of the optical fiber OF extends into the housing of the laser module 1. Note that the side wall of the housing of the laser module 1 is not illustrated in FIG. 1.

The bottom plate B, which corresponds to "substrate" recited in the Claims, is constituted by a pair of main surfaces facing each other and four side surfaces. One of the pair of main surfaces of the bottom plate B facing each other which one is located on a positive side along a z axis in a coordinate system shown in FIG. 1 will be hereinafter referred to as a mounting surface S. The mounting surface S includes at least seven sub-mounting surfaces $SS_i$. The sub-mounting surfaces $SS_i$ are each a flat surface that extends along (in Embodiment 1, parallel to) an xy plane in the coordinate system shown in FIG. 1. The sub-mounting surfaces $SS_i$ are provided in a step-like configuration such that respective heights of the sub-mounting surfaces $SS_i$ descend toward the entrance end surface $OF_I$ of the optical fiber OF. In other words, the bottom plate B is configured such that (i) the height of a sub-mounting surface $SS_i$ located furthest from the entrance end surface $OF_I$ is the greatest, (ii) the heights of the sub-mounting surfaces $SS_i$ gradually descend toward the entrance end surface $OF_I$, and (iii) the height of a sub-mounting surface $SS_7$ located closest to the entrance end surface $OF_I$ is the smallest.

On the sub-mounting surfaces $SS_i$, respective laser diodes $LD_i$ are mounted. The laser diode $LD_i$ (i=1, 2, . . . , 6, 7) are arranged in this order in accordance with a descending order of an optical path length $LO_i$, which is a length of an optical path extending from an exit end surface of the laser diode $LD_i$ to the entrance end surface $OF_I$ of the optical fiber OF. That is, a laser diode $LD_1$ is located furthest from the entrance end surface $OF_I$ and has the longest optical path length $LO_1$, and a laser diode $LD_7$ is located closest to the entrance end surface $OF_I$ and has the shortest optical path length $LO_1$.

On the sub-mounting surface $SS_i$, not only the laser diode $LD_i$ but also an S-axis collimating lens $SL_i$, an F-axis collimating lens $FL_i$, and a mirror $M_i$, each of which corresponds to the laser diode $LD_i$, are mounted. That is, the laser diode $LD_i$, the S-axis collimating lens $SL_i$, the F-axis collimating lens $FL_i$, and the mirror $M_i$ are mounted on the sub-mounting surface $SS_i$. A unit optical system which couples a laser beam $LB_i$ to a laser beam which propagates through the optical fiber OF is constituted by (i) the laser diode $LD_i$, the S-axis collimating lens $SL_i$, the F-axis collimating lens $FL_i$, and the mirror $M_i$ mounted on each single sub-mounting surface $SS_i$, (ii) the condenser lens FL, and (iii) the optical fiber OF.

The laser diodes $LD_i$ (where i is a natural number; $1 \le i \le 7$) are light sources which respectively emit laser beams $LB_1$ to $LB_7$. In Embodiment 1, each laser diode $LD_i$ is a laser diode which is arranged such that in the coordinate system illustrated in FIG. 1, an active layer is parallel to the xy plane and an exit end surface is parallel to a zx plane. A laser beam $LB_i$ emitted from each laser diode $LD_i$ travels in a direction (traveling direction) corresponding to a positive direction of a y axis. The laser beam has a Fast axis (F axis) parallel to the z axis and a Slow axis (S axis) parallel to an x axis. These laser diodes $LD_i$ are mounted on respective sub-mounting surfaces $SS_i$ which differ in height as described above. The laser diodes $LD_1$ to $LD_7$ are arranged such that an exit end surface of each laser diode $LD_i$ is aligned on a certain plane parallel to the zx plane. Accordingly, optical axes of the laser beams $LB_i$ extend along (in Embodiment 1, parallel to) the respective sub-mounting surfaces $SS_i$.

The F-axis collimating lens $FL_i$ is provided in an optical path of each laser beam $LB_i$. In Embodiment 1, F-axis collimating lenses $FL_1$ to $FL_7$ are identical in configuration. In Embodiment 1, the F-axis collimating lens $FL_i$ is a plano-convex cylindrical lens which is arranged such that in the coordinate system shown in FIG. 1, a flat surface (entrance face) faces in a negative direction of the y axis and a curved surface (exit face) faces in the positive direction of the y axis. The F-axis collimating lens $FL_i$ is arranged so as to have an arc-like outer edge of a cross section parallel to a yz plane on a positive side along the y axis. Then, the F-axis collimating lens $FL_i$ collimates the laser beam $LB_i$ diverging in an F-axis direction.

In an optical path of the laser beam $LB_i$ having passed through the F-axis collimating lens $FL_i$, an S-axis collimating lens $SL_i$ is provided. In Embodiment 1, S-axis collimating lenses $SL_1$ to $SL_7$ are identical in configuration. In Embodiment 1, the S-axis collimating lens $SL_i$ is a plano-convex cylindrical lens which is arranged such that in the coordinate system shown in FIG. 1, a flat surface (entrance face) faces in the negative direction of the y axis and a curved surface (exit face) faces in the positive direction of the y axis. The S-axis collimating lens $SL_i$ is provided so as to have an arc-like outer edge of a cross section parallel to the xy plane on a positive side along the y axis. Then, the S-axis collimating lens $SL_i$ collimates the laser beam $LB_i$ diverging in an S-axis direction, which laser beam $LB_i$ has been emitted from the laser diode $LD_i$.

In an optical path of the laser beam $LB_i$ having passed through the S-axis collimating lens $SL_i$, the mirror $M_i$ is provided. The mirror $M_i$ has a reflective surface whose normal vector is perpendicular to the z axis and makes an angle of 45° with respect to a positive direction of the x axis and with respect to the negative direction of the y axis. The reflective surface of the mirror $M_i$ reflects the laser beam $LB_i$ so as to convert (bend) the traveling direction of the laser beam $LB_i$ from the positive direction of the y axis to the positive direction of the x axis and also to convert the laser beam $LB_i$ from a state in which the S axis is parallel to the x axis to a state in which the S axis is parallel to the y axis.

These mirrors $M_i$ are arranged such that optical path lengths $LM_i$ from the laser diodes $LD_i$ to respectively corresponding mirrors $M_i$ are identical. Then, respective optical axes of the laser beams $LB_i$ having been reflected by the mirrors $M_i$ are parallel to one another in a plane parallel to the zx plane.

In an optical path of the laser beam $LB_i$ having been reflected by the mirror $M_i$, the condenser lens FL is provided. In Embodiment 1, the condenser lens FL is a plano-convex lens which is arranged such that in the coordinate system shown in FIG. 1, a curved surface (exit face) faces in a negative direction of the x axis and a flat surface (entrance face) faces in the positive direction of the x axis.

The condenser lens FL is arranged so as to have an arc-like outer edge of a cross section parallel to the xy plane on a negative side along the x axis and also to have an arc-like outer edge of a cross section parallel to the zx plane on a negative side along the x axis. Then, the condenser lens FL (i) condenses the laser beams $LB_i$, which have been reflected by the mirrors $M_i$, so that the optical axes of these laser beams $LB_i$ intersect with one another at one point and at the same time, (ii) condenses each of the laser beams $LB_i$ so that a diameter of each of the laser beams $LB_i$ reduces.

At an intersection of the optical axes of the laser beams $LB_i$ having passed through the condenser lens FL, the entrance end surface $OF_I$ of the optical fiber OF is provided. The optical fiber OF is provided such that the entrance end surface $OF_I$ faces in the negative direction of the x axis. The laser beams $LB_i$ having been condensed by the condenser lens FL enter the optical fiber OF via this entrance end surface $OF_I$. That is, the laser beams $LB_i$ emitted from the laser diodes $LD_i$ are optically coupled to a laser beam which propagates through the optical fiber.

(Arrangement of F-Axis Collimating Lens $FL_i$ and Coupling Efficiency)

A characteristic feature of a laser module in accordance with Embodiment 1 is arrangement of the F-axis collimating lens $FL_i$. More specifically, a characteristic feature of the laser module 1 in accordance with Embodiment 1 is arrangement of the F-axis collimating lens $FL_1$ corresponding to the laser diode $LD_1$. This characteristic feature of the laser module 1 will be described below with reference to FIGS. 2 to 4C.

Figure 2:
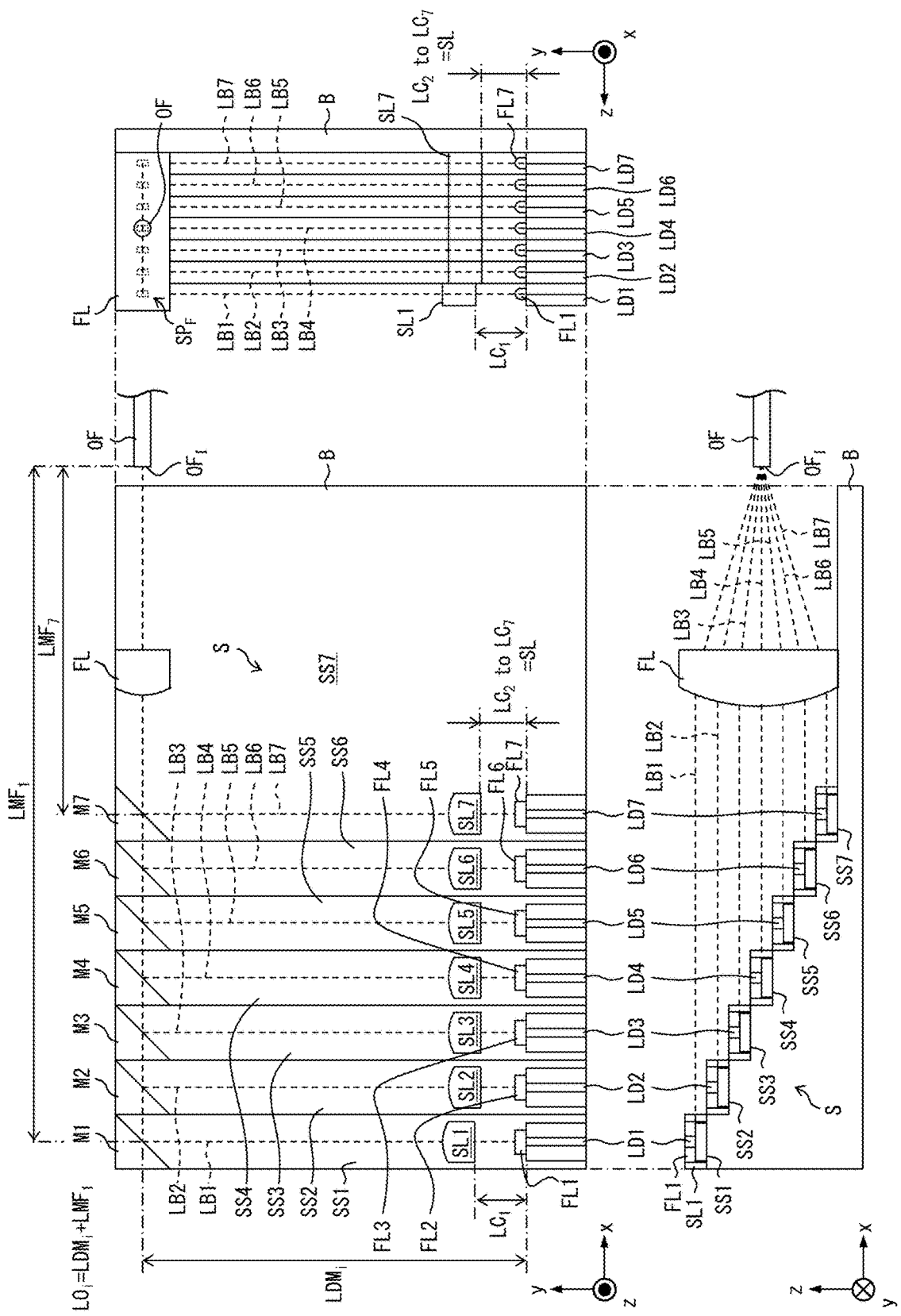
FIG. 2 is a three-view drawing of the laser module illustrated in FIG. 1.

FIG. 2 is a three-view drawing (a plane view, a front view, and a left side view) of the laser module 1. Among the side surfaces of the laser module 1 illustrated in FIG. 2, (1) a side surface located on a negative side along the y axis and extending along the zx plane is referred to as a front surface of the laser module 1 and (2) a side surface located on a positive side along the x axis and extending along the yz plane is referred to as a left side surface of the laser module 1.

FIG. 3A is a view schematically illustrating a unit optical system in a case of i=4 among unit optical systems included in the laser module 1. FIG. 3B is a view schematically illustrating a unit optical system in a case of i=1 among unit optical systems included in the laser module 101 of Comparative Example illustrated in FIG. 7. FIG. 3C is a plan view schematically illustrating a unit optical system in a case of i=1 among the unit optical systems included in the laser module 1. The unit optical system in the case of i=4 is a unit optical system whose optical path length $LO_i$ has an intermediate value among the unit optical systems included in the laser module 1 and which serves as a reference in designing of the laser module 1. The unit optical system in the case of i=1 is a unit optical system whose optical path length $LO_i$ is the longest among the unit optical systems included in the laser module 1 and which includes features of the laser module 1. As such, in Embodiment 1, arrangement of the F-axis collimating lens $FL_i$ will be described with reference to the unit optical system in the case of i=1 and the unit optical system in the case of i=4.

Note that FIGS. 3A-3C do not contain any F-axis-related information of optical paths of the unit optical systems. Accordingly, FIGS. 3A-3C do not illustrate the F-axis collimating lenses $FL_i$ included in the respective unit optical systems.

A line RR' shown in each of FIGS. 3A-3C indicates a position of a reflective surface of the mirror $M_i$ of each unit optical system, to simplify the plane view and thus help understand the optical path of the laser beam $LB_i$. Accordingly, in FIGS. 3A-3C, optical paths for the unit optical systems do not appear bent but unfolded straight.

A line EE' shown in each of FIGS. 3A-3C indicates a position of the exit end surface of the laser diode $LD_i$ included in each unit optical system. A line II' shown in each of FIGS. 3A-3C indicates a position of the entrance end surface $OF_I$ of the optical fiber OF. In each of FIGS. 3A-3C, an arrow shown on the line EE' indicates a spot size $SP_E$ of the laser beam $LB_i$ at the exit end surface of the laser diode $LD_i$, an arrow shown inside the condenser lens FL indicates a spot size $SP_F$ of the laser beam $LB_i$ at the entrance face of the condenser lens FL, and an arrow shown on the line II' indicates a spot size $SP_I$ of the laser beam $LB_i$ at the entrance end surface $OF_I$. The spot size $SP_E$ is in other words a width of a near-field pattern of the laser beam $LB_i$ along an S-axis (the x axis in the coordinate system shown in FIG. 1) and corresponds to "emitter size $ES_1$" recited in the Claims. In Embodiment 1, the spot size $SP_F$ is a spot size of the laser beam $LB_i$ at the entrance face of the condenser lens FL. Alternatively, the spot size $SP_F$ may be a spot size of the laser beam $LB_i$ at the exit face of the condenser lens FL. Note that the spot size $SP_F$ is also schematically shown in FIG. 2.

Figure 4A:
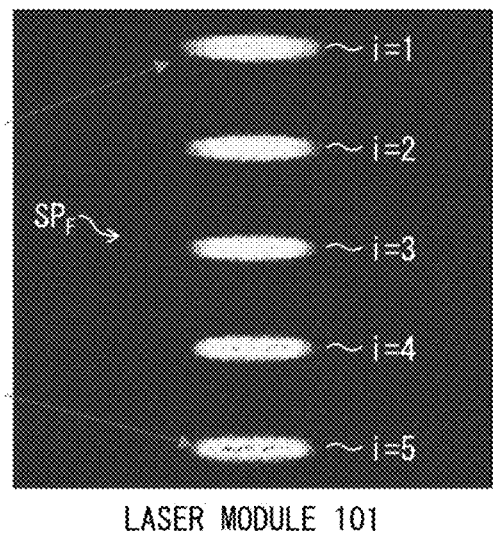
FIG. 4A is a view illustrating an illuminance distribution of each laser beam at an entrance face of a condenser lens which is included in both the laser module illustrated in FIG. 1 and the laser module of Comparative Example illustrated in FIG. 7.
Figure 4B:
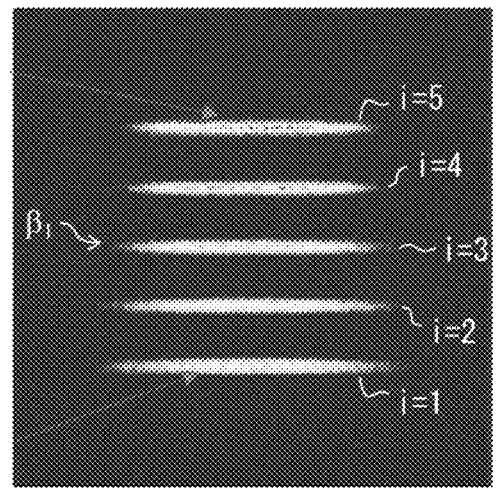
FIG. 4B is a view illustrating an angle distribution of each laser beam at an entrance face of an optical fiber included in the laser module of Comparative Example illustrated in FIG. 7.
Figure 4C:
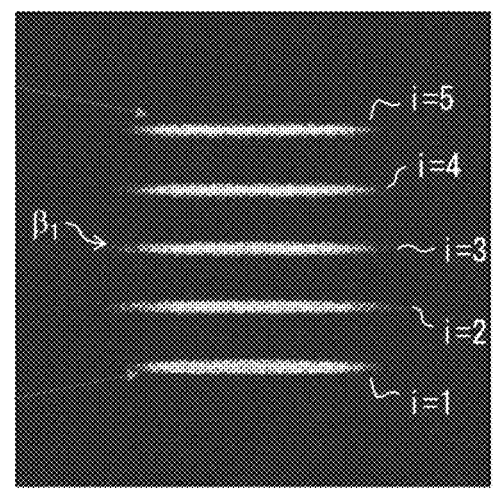
FIG. 4C is a view illustrating an angle distribution of each laser beam at an entrance face of an optical fiber included in the laser module illustrated in FIG. 1.
Figure 7:
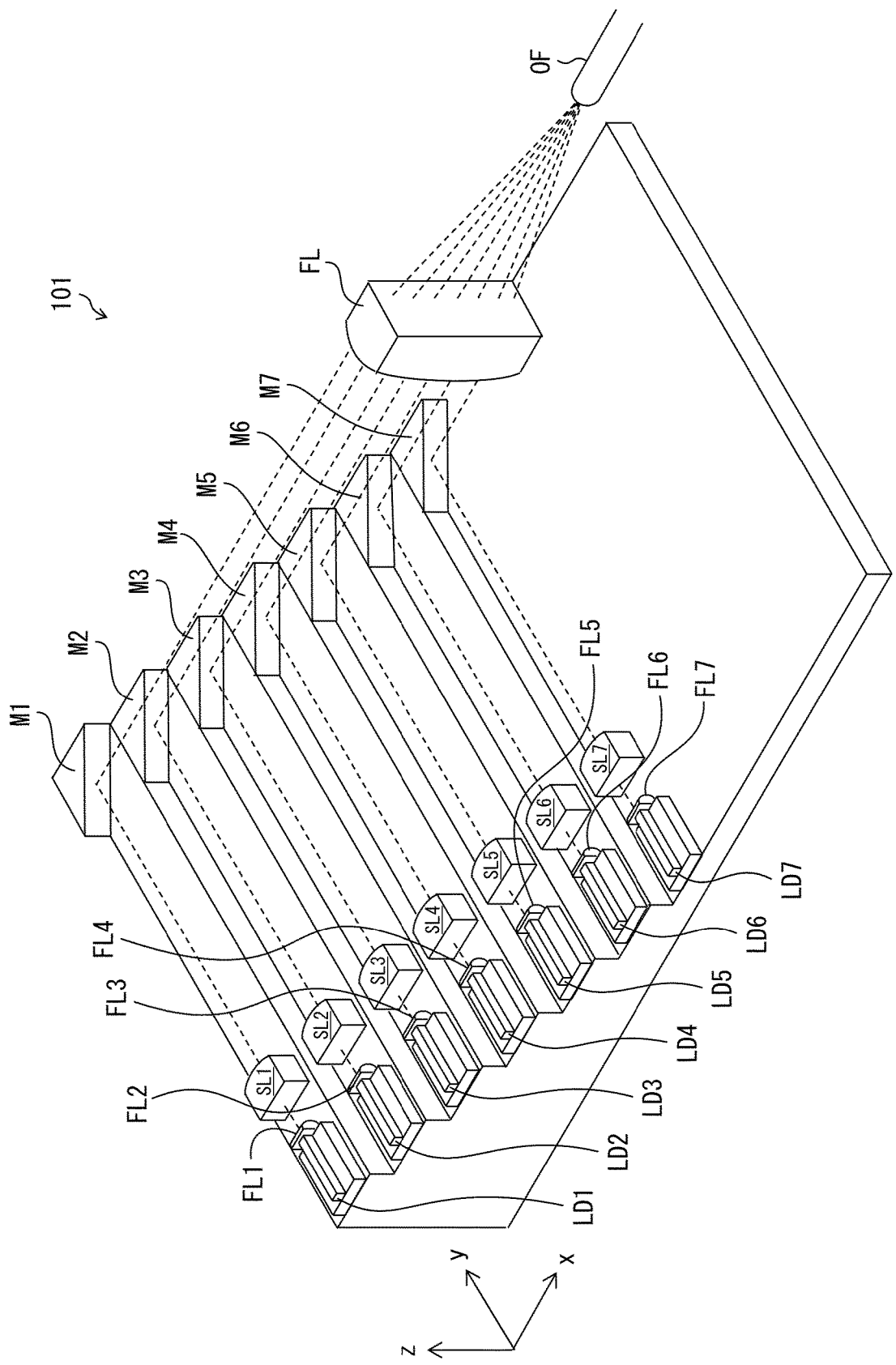
FIG. 7 is a perspective view of a conventional laser module.

FIG. 4A is a view illustrating an illuminance distribution of the laser beam $LB_i$ at the entrance face of the condenser lens FL which is included in both the laser module 1 and the laser module 101 illustrated in FIG. 7. FIG. 4B is a view illustrating an angle distribution of the laser beam $LB_i$ at the entrance face $OF_I$ of the optical fiber OF included in the laser module 101. FIG. 4C is a view illustrating an angle distribution of each laser beam at the entrance face $OF_I$ of the optical fiber OF included in the laser module 1. The laser module 101 is a Comparative Example of the laser module 1. The following description will be given partly with reference to the laser module 101. FIG. 7 is a perspective view of the laser module 101.

The following description will first discuss an issue of the laser module 101 and then explain how the laser module 1 deals with the issue.

As illustrated in FIG. 2, a distance from the laser diode $LD_i$ to the S-axis collimating lens $SL_i$ is defined to be a collimation length $LC_i$.

In the laser module 101, the S-axis collimating lenses $SL_1$ to $SL_7$ are arranged such that each of the collimation lengths $LC_1$ to $LC_7$ coincides with a focal length (corresponding to "certain distance SL" recited in the Claims) of the S-axis collimating lens $SL_i$. This allows rays of each of the laser beams $LB_1$ to $LB_7$ emitted from the laser diodes $LD_1$ to $LD_7$ to be collimated by the S-axis collimating lenses $SL_1$ to $SL_7$ such that respective optical paths of the rays of each of the laser beams $LB_1$ to $LB_7$ are parallel to one another.

This will be discussed in more detail with reference to, for example, the unit optical system of i=4 illustrated in FIG. 3A. Rays of a laser beam $LB_4$, which rays have been emitted from each point of an emitter of a laser diode $LD_4$ and have a predetermined divergence angle, enter an entrance face of an S-axis collimating lens $SL_4$. The rays are refracted at the entrance face and a reflective face of the S-axis collimating lens $SL_4$ at predetermined angles so as to be emitted from the S-axis collimating lens $SL_4$ via the exit face of the S-axis collimating lens $SL_4$ in a state where respective optical paths of the rays are parallel to one another. Here, an angle between (i) a propagation direction of each of the rays of the laser beam $LB_4$ which rays have been emitted from an end portion of the emitter and converted by the S-axis collimating lens $SL_4$ into parallel rays and (ii) a propagation direction of a chief ray of the laser beam $LB_4$ is defined to be an angle $\alpha$. Note that rays whose optical paths spread outward (gradually become distant from one another) as in the case of the rays of the laser beam $LB_4$ which rays have been emitted from a certain point of the emitter will be hereinafter referred to as divergent rays, whereas rays whose optical paths gather inward (gradually approach one another) will be hereinafter referred to as convergent rays.

The rays of the laser beam $LB_4$ which rays have been converted by the S-axis collimating lens $SL_4$ into the parallel rays enter the entrance face of the condenser lens FL, which is distant from the S-axis collimating lens $SL_4$ by a lens-to-lens distance $LL_4$. The rays are refracted at the entrance face and a reflective face of the condenser lens FL at predetermined angles and emitted, as convergent rays whose optical paths gather inward, from the condenser lens FL via an exit end surface of the condenser lens FL.

The spot size $SP_F$ at the condenser lens FL increases due to the above-described angle $\alpha$ and in accordance with the lens-to-lens distance $LL_i$. This is readily understood from the fact that $LL_i \cdot \tan \alpha$ increases in accordance with the lens-to-lens distance $LL_i$. Therefore, the spot size $SP_F$ is the smallest in a case where the lens-to-lens distance $LL_i$ is the smallest (i=7), and the spot size $SP_F$ is the largest in a case where the lens-to-lens distance $LL_i$ is the largest (i=1) (see FIG. 4A).

Note that although the above description refers to the case of i=4, the same description applies also to each case of i=1, 2, 3, 5, 6, 7, except that the spot size $SP_F$ is different between each of those cases and the case of i=4 due to a difference in the lens-to-lens distance $LL_i$. As described above, the laser beam $LB_i$ emitted from the laser diode $LD_i$ and a laser beam which propagates through the optical fiber OF are optically coupled to each other. As used herein, a "coupling efficiency" refers to a coupling efficiency between the laser beam $LB_i$ emitted from the laser diode $LD_i$ and a laser beam which propagates through the optical fiber OF.

In the laser module 101 having the configuration described above, the spot size $SP_F$ is the smallest in a case where the lens-to-lens distance $LL_i$ is the smallest (i=7), and is the greatest in a case where the lens-to-lens distance $LL_i$ is the greatest (i=1). Accordingly, when the largest one of incident angles at which the rays of the laser beam $LB_i$ respectively enter the entrance face $OF_I$ is defined to be an angle $\beta_i$, an angle $\beta_1$ is the largest among angles $\beta_1$ to $\beta_7$.

A coupling efficiency between the laser beam $LB_i$ and a laser beam which propagates through the optical fiber OF tends to decrease as an incident angle at which the laser beam $LB_i$ enters the entrance face $OF_I$ increases. Accordingly, when respective coupling efficiencies of the laser beams $LB_1$ to $LB_7$ are compared, the coupling efficiency of each of the laser beams $LB_1$ to $LB_3$ tends to be lower than that of the laser beam $LB_4$ (the coupling efficiency which serves as a reference in designing of the laser module 1). Further, when the coupling efficiencies of the laser beams $LB_1$ to $LB_3$ are compared, the laser beam $LB_1$ has the lowest coupling efficiency, followed by the laser beam $LB_2$ and then by the laser beam $LB_3$.

The laser module 1 is therefore configured, with particular attention to the laser beam $LB_1$ having the lowest coupling efficiency in the laser module 101, such that a position of the S-axis collimating lens $SL_1$ is shifted toward a positive side along the y axis so that the collimation length $LC_1$ of the S-axis collimating lens $SL_1$ is longer than the focal length of the S-axis collimating lens $SL_i$ (see FIG. 2).

That is, the unit optical system in the case of i=1 in the laser module 1 is configured such that, as illustrated in FIG. 3C, a distance between the position of the S-axis collimating lens $SL_1$ and the exit end surface of the laser diode $LD_1$ is greater than that of the unit optical system in the case of i=1 in the laser module 101 illustrated in FIG. 3B.

As such, after rays of the laser beam $LB_1$ emitted from the laser diode $LD_1$ are refracted by the S-axis collimating lens $SL_1$, the rays are not parallel rays but convergent rays that make an angle $\alpha$ with a propagation direction of a chief ray of the laser beam $LB_1$. Accordingly, the unit optical system in the case of i=1 in the laser module 1 has a spot size $SP_F$ smaller than that of the unit optical system included in the case of i=1 in the laser module 101. That is, the angle $\beta_i$ of the unit optical system in the case of i=1 in the laser module 1 is smaller than that of the unit optical system in the case of i=1 in the laser module 101. This is readily understood from a comparison between FIGS. 4B and 4C.

Therefore, the laser module 1 having the above-described configuration achieves an improved coupling efficiency as compared with the laser module 101 in which the collimation lengths $LC_1$ to $LC_7$ uniformly coincide with the focal length of the S-axis collimating lens $SL_i$.

(Other Configurations)

The above description of Embodiment 1 has explained that arranging the S-axis collimating lens $SL_1$ so as to satisfy $SL<LC_1$ enables improving the coupling efficiency, in a configuration in which the certain distance SL coincides with the focal length of the S-axis collimating lens $SL_i$ (i.e., in a configuration in which rays of a laser beam become parallel rays after passing through the S-axis collimating lens).

Note that the laser module 1 may be configured such that the certain distance SL is set to be shorter than the focal length of the S-axis collimating lens $SL_i$ (i.e., such that rays of a laser beam become divergent rays after passing through the S-axis collimating lens). Also in this case, arranging the S-axis collimating lens $SL_1$ so as to satisfy $SL<LC_1$ enables improving the coupling efficiency.

Further, the above description of Embodiment 1 has discussed a case in which only the position of the S-axis collimating lens $SL_1$ is set to satisfy $SL<LC_1$. However, a laser module may be configured such that, when a laser diode that is neither the laser diode $LD_1$ nor the laser diode $LD_n$ (e.g., the laser diode $LD_7$) is defined to be a laser diode $LD_m$, an S-axis collimating lens $SL_j$ corresponding to each laser diode $LD_j$ ($2 \leq j \leq m$, $2 \leq m \leq n-1$) is arranged so as to satisfy $SL<LC_m \leq LC_j<LC_1$. For example, in a case of m=3, the S-axis collimating lenses $SL_1$ to $SL_3$ may be arranged so as to satisfy $SL<LC_3<LC_2<LC_1$.

With this configuration, not only the laser beam $LB_1$ but also the laser beams $LB_2$ to $LB_m$ can achieve a reduction in the angle $\beta_i$, which is a maximum value of an incident angle of a laser beam. This enables improving the coupling efficiency not only of the laser beam $LB_1$ but also of the laser beams $LB_2$ to $LB_m$.

Further, a laser module may be configured such that the certain distance SL is set such that (i) respective optical paths of rays of a laser beam emitted from each of the laser diodes $LD_i$ are parallel to one another or diverged after the rays have passed through a corresponding one of the collimating lenses $SL_i$ and (ii) at least an S-axis collimating lens $SL_n$ (e.g., the S-axis collimating lens $SL_7$) is arranged so as to satisfy $LC_n<SL$ (e.g., $LC_7<SL$).

The angle $\beta_i$ of the laser beam $LB_i$ and the spot size of the laser beam $LB_i$ are in a trade-off relationship. Thus, the angle $\beta_i$ and the spot size of the laser beam $LB_i$ cannot be reduced to below their limits at the same time. As such, an excessively small angle $\beta_i$ results in an excessively large spot size of the laser beam, which may cause a decrease in the coupling efficiency of the laser beam $LB_i$.

The above-described configuration enables preventing the angle $\beta_i$ of the laser beam $LB_i$ from becoming too small and thus preventing a decrease in the coupling efficiency of the laser beam $LB_i$. Note that the angle $\beta_i$ of the laser beam $LB_i$ can be adjusted by adjusting a curvature of the condenser lens FL. This adjusting technique, however, may excessively reduce an angle $\beta_i$ of one of the laser beams $LB_i$ (e.g., an angle $\beta_n$ of a laser beam $LB_n$) since the laser module 1 includes a single condenser lens FL which collectively condenses the n laser beams $LB_i$. Such an issue is prevented by employing the above-described configuration which reduces a difference between incident angles of the laser beams $LB_i$ (approximating the incident angles to one another) to thereby achieve the angle $\beta_i$ and the spot size $SP_I$ that are both suitable for preventing a decrease in the coupling efficiency.

Further, a laser module may be configured such that (i) the certain distance SL is set such that rays of the laser beam $LB_i$ emitted from the laser diode $LD_i$ become convergent rays after passing through the S-axis collimating lens $SL_i$ and (ii) at least the S-axis collimating lens $SL_n$ is arranged so as to satisfy $SL<LC_n$.

There can be a case in which the certain distance SL is set such that rays of the laser beam $LB_i$ becomes convergent rays after passing through the S-axis collimating lens $SL_i$. In such a case where the certain distance SL is set so as to cause rays of the laser beam $LB_i$ to become convergent rays, the spot size $SP_F$ of the laser beam $LB_i$ at the condenser lens FL after the laser beam $LB_i$ has passed through the S-axis collimating lens $SL_i$ may decrease as the lens-to-lens distance $LL_i$ increases.

The laser diode $LD_n$ is arranged so as to have a lens-to-lens distance $LL_n$ (an optical path length LOU) shorter than a lens-to-lens distance of each of the other laser diodes $LD_1$ to $LD_{n-1}$. As such, in a case where the certain distance SL is set so as to cause rays of the laser beam $LB_i$ to become convergent rays, a laser beam emitted from the laser diode $LD_n$ tends to have a spot size (i.e., an incident angle) larger than that of a laser beam emitted from each of the laser diodes other than the laser diode $LD_n$.

The above configuration enables reducing an incident angle (i.e., the angle $\beta_i$) at which the laser beam $LB_n$ enters the entrance face $OF_f$, in a case where the certain distance SL is set so as to cause rays of the laser beam $LB_i$ to become convergent rays. This enables reducing a difference between respective incident angles at which the laser beams $LB_i$, which differ in the optical path length $LO_i$, enter the entrance face $OF_f$.

Further, the laser module in which the certain distance SL is set so as to cause rays of the laser beam $LB_i$ to become convergent rays may be configured such that when a laser diode that is neither the laser diode $LD_1$ nor the laser diode $LD_n$ is defined to be a laser diode $LD_m$, an S-axis collimating lens $SL_j$ corresponding to each laser diode $LD_j$ ($m \leq j \leq n-1$, $2 \leq m \leq n-1$) is arranged so as to satisfy $SL<LC_m \leq LC_j<LC_n$. For example, in a case of m=5, the S-axis collimating lenses $SL_5$ to $SL_7$ may be arranged so as to satisfy $SL<LC_5<LC_6<LC_7$.

With this configuration, not only the laser beam $LB_n$ but also the laser beams $LB_m$ to $LB_{n-1}$ can achieve a reduction in the incident angle (i.e., the angle $\beta_i$) at which a laser beam enters the entrance face $OF_f$. This enables improving the coupling efficiency not only of the laser beam $LB_n$ but also of the laser beams $LB_m$ to $LB_{n-1}$.

Further, the laser module in which the certain distance SL is set so as to cause rays of the laser beam $LB_i$ to become convergent rays may be configured such that at least the S-axis collimating lens $SL_1$ is arranged so as to satisfy $LC_1<SL$.

The laser diode $LD_1$ is arranged such that the optical path length $LO_1$ is longer than the optical path length of each of the other laser diodes $LD_2$ to $LD_n$. Accordingly, with a configuration in which rays of the laser beam $LB_i$ become convergent rays after passing through the S-axis collimating lens $SL_i$, a laser beam emitted from the laser diode $LD_1$ tends to have an angle $\beta_i$ smaller than that of a laser beam emitted from each of the laser diodes other than the laser diode $LD_1$.

The above-described configuration prevents the angle $\beta_1$ of the laser beam $LB_1$ from becoming too small and thus prevents a decrease in the coupling efficiency of the laser beam $LB_1$. Note that the angle $\beta_i$ of the laser beam $LB_i$ can be adjusted by adjusting a curvature of the condenser lens FL. This adjusting technique, however, may excessively reduce an angle $\beta_i$ of one of the laser beams $LB_i$ (e.g., the angle $\beta_i$ of the laser beam $LB_1$) since the laser module 1 includes a single condenser lens FL which collectively condenses the n laser beams $LB_i$. Such an issue is prevented by employing the above-described configuration which reduces a difference between incident angles of the laser beams $LB_i$ (approximating the incident angles to one another) to thereby achieve the angle $\beta_i$ and the spot size $SP_I$ that are both suitable for preventing a decrease in the coupling efficiency.

Further, as described above, the laser module 1 may include the n mirrors $M_i$ each arranged such that a corresponding one of the optical paths of the laser beams $LB_i$ is bent at a predetermined angle (in Embodiment 1, 90°).

With this configuration, an optical path from each laser diode $LD_i$ to the optical fiber OF is bent by the mirror $M_i$ at a predetermined angle. This enables reducing a length of the laser module 1. Note that the "length" of the laser module 1 refers to one of dimensions of the laser module which one is measured along a direction (the x axis direction in the coordinate system shown in FIG. 1) parallel to a central axis of the optical fiber OF.

Further, as described above, the laser module 1 may be configured such that the laser module 1 further includes a substrate having a mounting surface S on which the laser diodes $LD_i$, the S-axis collimating lenses $SL_i$, and the mirrors $M_i$ are mounted, the mounting surface S including at least n sub-mounting surfaces $SS_i$ provided in a step-like configuration such that respective heights of the sub-mounting surfaces $SS_i$ descend toward the optical fiber, on each of the sub-mounting surfaces $SS_i$, a corresponding one of the laser diodes $LD_i$, a corresponding one of the S-axis collimating lenses $SL_i$, and a corresponding one of the mirrors $M_i$ being mounted.

This configuration, in which each laser diode $LD_i$, each S-axis collimating lens $SL_i$, and each mirror $M_i$ are mounted on a corresponding one of the sub-mounting surfaces $SS_i$ which differ in height, allows laser beams $LB_i$, which have been emitted from the respective laser diodes $LD_i$ and passed through the respective S-axis collimating lenses $SL_i$ and whose optical paths have been bent by the respective mirrors $M_i$, to be at respective different heights.

Further, a laser module may be configured such that when a curvature of each of the S-axis collimating lenses $SL_i$ is defined to be a curvature $r_i$, at least one of a curvature $r_1$ of an S-axis collimating lens $SL_1$ corresponding to a laser diode $LD_1$ and a curvature $r_n$ of an S-axis collimating lens $SL_n$ corresponding to a laser diode $LD_n$ differs from a curvature of each of the other ones of the collimating lenses $SL_i$.

A laser module may have a configuration modified from the configuration of the laser module 1 such that one of the curvature $r_1$ and the curvature $r_n$ differs from a curvature of each of the other ones of the collimating lenses $SL_i$, unlike in the laser module 1 in which one of the collimation length $LC_1$ and the collimation length $LC_n$ differs from the certain distance SL. This configuration allows the laser module to provide the same effect as the laser module 1 in which one of the collimation length $LC_1$ and the collimation length $LC_n$ differs from the certain distance SL.

Further, the above laser module may be configured such that at least the curvature $r_1$ is smaller than the curvature of each of the other ones of the collimating lenses $SL_i$.

With this configuration, in a case where rays of each of the laser beams $LB_i$ become parallel rays or divergent rays after passing through a corresponding one of the S-axis collimating lenses $SL_i$, it is possible to provide the same effect as a configuration in which at least the S-axis collimating lens $SL_1$ are arranged so as to satisfy $SL<LC_1$.

Further, a laser module may be configured such that when a size of an emitter included in each of the laser diodes $LD_i$ is defined to be an emitter size $ES_i$, at least one of an emitter size $ES_1$ and an emitter size $ES_n$ differs from an emitter size of each of the other ones of the laser diodes $LD_i$.

A laser module may have a configuration modified from the configuration of the laser module 1 such that one of the emitter size $ES_1$ and the emitter size $ES_n$ differs from a emitter size of each of the other ones of the laser diodes $LD_i$, unlike in the laser module 1 in which one of the collimation length $LC_1$ and the collimation length $LC_n$ differs from the certain distance SL. This configuration allows the laser module to provide the same effect as the laser module 1 in which one of the collimation length $LC_1$ and the collimation length $LC_n$ differs from the certain distance SL.

Further, a laser module may be arranged such that at least the emitter size $ES_1$ is smaller than the emitter size of each of the other ones of the laser diodes $LD_i$.

This configuration allows the laser module to provide the same effect as the laser module 1 in which at least the S-axis collimating lens $SL_1$ is arranged so as to satisfy $SL<LC_1$, in a case where rays of each of the laser beams $LB_i$ become parallel rays or divergent rays after passing through a corresponding one of the S-axis collimating lenses $SL_i$.

Example 1

Figure 5A:
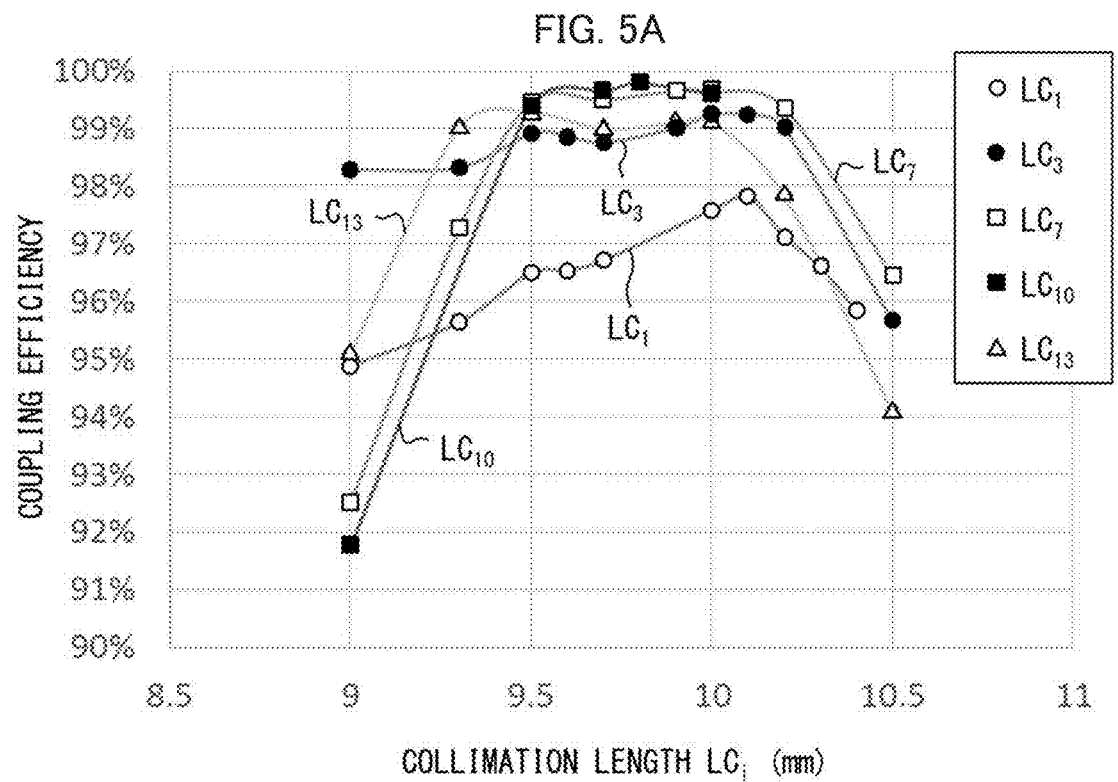
FIG. 5A is a graph illustrating a correlation between a coupling efficiency and a collimation length of a unit optical system included in a laser module of Example 1 of the present invention.
Figure 5B:
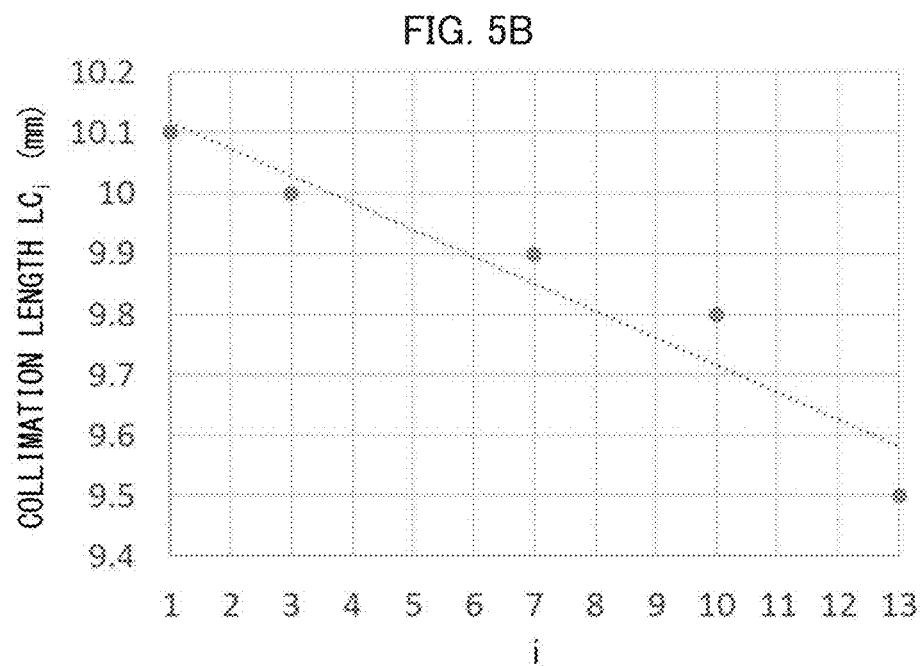
FIG. 5B is a graph illustrating a collimation length for each unit optical system included in the laser module of Example 1 of the present invention.

The following description will discuss a laser module 1 in accordance with Example 1 of the present invention with reference to FIGS. 5A-5B. The laser module 1 of Example 1 was obtained by modifying the configuration of the laser module 1 illustrated in FIG. 1 such that the number of the unit optical systems is increased from n=7 to n=13.

FIG. 5A is a graph illustrating a correlation between a coupling efficiency and a collimation length $LC_i$ of a unit optical system included in the laser module 1 of Example 1. FIG. 5B is a graph illustrating a collimation length $LC_i$ for each unit optical system included in the laser module 1 of Example 1.

As FIG. 5A indicates, causing each collimation length $LC_i$ (i=1, 3, 7, 10, 13) to change within a range of 9 mm to 10.5 mm causes a change in the coupling efficiency of a laser beam $LB_i$. From results illustrated in FIG. 5A, a collimation length $LC_i$ for each case of i (i=1, 3, 7, 10, 13) was taken and plotted with respect to i as illustrated in FIG. 5B. In FIG. 5B, a line obtained by fitting those collimation lengths $LC_i$ by the least-square method is indicated with a dotted line.

As FIG. 5B indicates, an increase in coupling efficiency is achieved by setting the collimation length $LC_i$ to be shorter as the value of i increases and to be longer as the value of i decreases, with respect to a collimation length $LC_7$ (=9.9 mm) for i=7 as a reference value, which collimation length $LC_7$ served as a reference in designing of the laser module 1.

Note that the above description of Embodiment 1 discussed a case in which a position of a part of S-axis collimating lenses $SL_i$ differs from a certain distance SL. Alternatively, a laser module 1 may employ a configuration in which positions of all of the S-axis collimating lenses $SL_i$ differ from the certain distance SL. In such a case, the respective collimation lengths $LC_i$ may satisfy $LC_1 > LC_2 > \ldots > LC_i > \ldots > LC_{12} > LC_{13}$.

Example 2

The following description will discuss a laser module in accordance with Example 2 of the present invention with reference to FIGS. 6A-6B. The laser module 1 of Example 2 was obtained by modifying the configuration of the laser module 101 illustrated in FIG. 7 such that the number of the unit optical systems is increased from n=7 to n=13 and the curvature $r_i$ of the S-axis collimating lens $SL_i$ is changed.

FIG. 6A is a graph illustrating a correlation between a coupling efficiency and a curvature $r_i$ of a unit optical system included in the laser module of Example 2. FIG. 6B is a graph illustrating a curvature $r_i$ for each unit optical system included in the laser module 1 of Example 2.

As FIG. 6A indicates, causing each curvature $r_i$ (i=1, 3, 7, 10, 13) to change within a range of 6.2 mm to 6.9 mm causes a change in the coupling efficiency of a laser beam $LB_i$. From results illustrated in FIG. 6A, a curvature $r_i$ for each case of i (i=1, 3, 7, 10, 13) was taken and plotted with respect to i as illustrated in FIG. 6B. In FIG. 6B, a line obtained by fitting those curvatures $r_i$ by the least-square method is indicated with a dotted line.

As FIG. 6B indicates, an increase in coupling efficiency is achieved by setting the curvature $r_i$ to be longer as the value of i increases and to be shorter as the value of i decreases, with respect to a curvature $r_i$ (=6.7 mm) for i=7 as a reference value, which curvature $r_i$ served as a reference in designing of the laser module 1.

Note that the above description of Embodiment 2 discussed a case in which the curvature $r_i$ of a part of the S-axis collimating lenses $SL_i$ is different from a certain distance SL. Alternatively, a laser module 1 may employ a configuration in which the curvatures $r_i$ of all of the S-axis collimating lenses $SL_i$ are different from one another. In such a case, the respective curvatures $r_i$ may satisfy $r_1 < r_2 < \ldots < r_i < \ldots < r_{12} < r_{13}$.

One or more embodiments of the present invention can also be expressed as follows:

A laser module 1 is a laser module, including: an optical fiber OF; n laser diodes $LD_i$ (i=1, 2, ..., n) arranged in this order in accordance with a descending order of an optical path length $LO_i$, the optical path length $LO_i$ being a length of an optical path extending from each of the laser diodes $LD_i$ to the optical fiber OF; and n collimating lenses $SL_i$ provided in the respective optical paths so as to be distant from the respective laser diodes $LD_i$ and from the optical fiber OF. In the laser module 1, when a distance from each of the laser diodes $LD_i$ to a corresponding one of the collimating lenses $SL_i$ is defined to be a collimation length $LC_i$, at least one of a collimation length $LC_1$ corresponding to a laser diode $LD_1$ and a collimation length $LC_n$ corresponding to a laser diode $LD_n$ differs from a certain distance SL which is set with respect to each of the collimating lenses $SL_i$.

The laser module is configured such that laser beams which have passed through the respective collimating lenses $SL_i$ after being emitted from the respective laser diodes $LD_i$ are collectively caused to enter the optical fiber. Each of the laser diodes $LD_i$ includes an emitter which has a certain, though small, size. Due to this size, rays of each of the laser beams enter the optical fiber at respective incident angles in a certain wide range within a predetermined angular range including a right angle. This certain width of the incident angle can decrease a coupling efficiency between the laser beam emitted from each of the laser diodes $LD_i$ and a laser beam which propagates through the optical fiber.

In the laser module, at least one of the collimation length $LC_1$ corresponding to the laser diode $LD_1$ and the collimation length $LC_n$ corresponding to the laser diode $LD_n$ differs from the certain distance SL. This configuration enables reducing at least one of an incident angle at which a laser beam emitted from the laser diode $LD_1$ enters the optical fiber and an incident angle at which a laser beam emitted from the laser diode $LD_n$ enters the optical fiber. In other words, the above configuration enables narrowing the predetermined angular range including a right angle. Therefore, the laser module achieves an improved coupling efficiency between laser beams emitted from the laser diodes and a laser beam which propagates through the optical fiber as compared with conventional laser modules.

Further, a laser module 1 may be configured such that: the certain distance SL is set such that respective optical paths of rays of a laser beam emitted from each of the laser diodes $LD_i$ are parallel to one another or diverged after the rays have passed through a corresponding one of the collimating lenses $SL_i$; and at least a collimating lens $SL_1$ is arranged so as to satisfy $SL < LC_1$.

In many cases, the certain distance SL is set such that respective optical paths of rays of a laser beam emitted from each of the laser diodes $LD_i$ are parallel to one another after the rays have passed through a corresponding one of the collimating lenses $SL_i$. There can be also a case in which the certain distance SL is such that the optical paths are diverged.

The laser diode $LD_1$ is arranged such that the optical path length $LO_1$ is longer than the optical path length of each of the other laser diodes $LD_2$ to $LD_n$. Accordingly, in a case where the certain distance SL is set so as to cause the optical paths to be parallel to one another or diverged, a laser beam emitted from the laser diode $LD_1$ has an incident angle greater than that of a laser beam emitted from each of the laser diodes other than the laser diode $LD_1$.

The above configuration enables reducing an incident angle of a laser beam emitted from the laser diode $LD_1$, in a case where the certain distance SL is set so as to cause the optical paths to be parallel or diverged.

Further, a laser module 1 may be configured such that when a laser diode that is neither the laser diode $LD_1$ nor the laser diode $LD_n$ is defined to be a laser diode $LD_m$, a collimating lens $SL_j$ ($2 \le j \le m$) corresponding to each laser diode $LD_j$ is arranged so as to satisfy $SL < LC_m \le LC_j < LC_1$.

In the above configuration, not only the collimating lens $SL_1$ but also the collimating lenses $SL_2$ to $SL_m$ corresponding to the respective laser diodes $LD_2$ to $LD_m$ are arranged such that the collimation lengths $LC_2$ to $LC_m$ are each longer than the certain distance SL. Also, the collimation lengths $LC_2$ to $LC_m$ are set to decrease in this order. This configuration enables reducing an incident angle of not only a laser beam emitted from the laser diode $LD_1$ but also an incident angle of each of laser beams emitted from the respective laser diodes $LD_2$ to $LD_m$.

Further, a laser module 1 may be configured such that: the certain distance SL is set such that respective optical paths of rays of a laser beam emitted from each of the laser diodes $LD_i$ are parallel to one another or diverged after the rays have passed through a corresponding one of the collimating lenses $SL_i$; and at least a collimating lens $SL_n$ is arranged so as to satisfy $LC_n < SL$.

The laser diode $LD_n$ is arranged so as to have an optical path length $LO_n$ shorter than an optical path length of each of the other laser diodes $LD_1$ to $LD_{n-1}$. As such, in a configuration in which respective optical paths of rays of each laser beam are parallel to one another after the rays have passed through a corresponding one of the collimating lenses $SL_i$, a laser beam emitted from the laser diode $LD_n$ tends to have an incident angle smaller than that of a laser beam emitted from each of the laser diodes other than the laser diode $LD_n$.

Note here that an incident angle of a laser beam (i.e., a numerical aperture of the laser beam) and a spot size of the laser beam are in such a relationship that reducing one of the incident angle and the spot size inevitably results in increasing the other. As such, an excessively small incident angle of a laser beam emitted from the laser diode $LD_n$ results in an excessively large spot size of the laser beam, which may cause a decrease in a coupling efficiency between the laser beam emitted from the laser diode $LD_n$ and a laser beam which propagates through the optical fiber.

The above-described configuration enables preventing the incident angle of the laser beam emitted from the laser diode $LD_n$ from becoming too small.

Further, a laser module 1 may be configured such that: the certain distance SL is set such that respective optical paths of rays of a laser beam emitted from each of the laser diodes $LD_i$ are converged after the rays have passed through a corresponding one of the collimating lenses $SL_i$; and at least a collimating lens $SL_n$ is arranged so as to satisfy $SL < LC_n$.

There can be a case in which the certain distance SL is set such that respective optical paths of rays of a laser beam emitted from each of the laser diodes $LD_i$ are converged after the rays have passed through a corresponding one of the collimating lenses $SL_i$. In such a case where the certain distance SL is set so as to cause the optical paths to be converged, the spot size of the laser beam having passed through the S-axis collimating lens $SL_i$ may decrease as a distance from the collimating lens $SL_i$ increases.

The laser diode $LD_n$ is arranged so as to have an optical path length $LO_n$ shorter than an optical path length of each of the other laser diodes $LD_1$ to $LD_{n-1}$. As such, in a case where the certain distance SL is set so as to cause the optical paths to be converged, a laser beam emitted from the laser diode $LD_n$ tends to have a spot size larger than that of a laser beam emitted from each of the laser diodes other than the laser diode $LD_n$.

The above configuration enables reducing an incident angle of a laser beam emitted from the laser diode $LD_n$, in a case where the certain distance SL is set so as to cause the optical paths to be converged.

Further, a laser module 1 may be configured such that: when a laser diode that is neither the laser diode $LD_1$ nor the laser diode $LD_n$ is defined to be a laser diode $LD_m$, a collimating lens $SL_j$ ($m \le j \le n-1$) corresponding to each laser diode $LD_j$ is arranged so as to satisfy $SL < LC_m \le LC_j < LC_n$.

In the above configuration, not only the collimating lens $SL_n$ but also the collimating lenses $SL_m$ to $SL_{n-1}$ corresponding to the respective laser diodes $LD_m$ to $LD_{n-1}$ are arranged such that the collimation lengths $LC_m$ to $LC_{n-1}$ are each longer than the certain distance SL. Also, the collimation lengths $LC_m$ to $LC_{n-1}$ are set to decrease in this order. This configuration enables reducing an incident angle not only of a laser beam emitted from the laser diode $LD_n$ but also of each of laser beams emitted from the respective laser diodes $LD_m$ to $LD_{n-1}$.

Further, a laser module 1 may be configured such that: the certain distance SL is set such that respective optical paths of rays of a laser beam emitted from each of the laser diodes $LD_i$ are converged after the rays have passed through a corresponding one of the collimating lenses $SL_i$; and at least a collimating lens $SL_i$ is arranged so as to satisfy $LC_1 < SL$.

The laser diode $LD_1$ is arranged so as to have an optical path length $LO_1$ longer than an optical path length of each of the other laser diodes $LD_2$ to $LD_n$. As such, in a configuration in which respective optical paths of rays of each laser beam are converged after the rays have passed through a corresponding one of the collimating lenses $SL_i$, a laser beam emitted from the laser diode $LD_1$ tends to have an incident angle smaller than that of a laser beam emitted from each of the laser diodes other than the laser diode $LD_1$.

As such, an excessively small incident angle as described above may cause a decrease in a coupling efficiency between the laser beam emitted from the laser diode $LD_1$ and a laser beam which propagates through the optical fiber. The above-described configuration enables preventing an excessively small incident angle of a laser beam emitted from the laser diode $LD_1$.

Further, a laser module 1 may be configured such that the laser module 1 further includes n mirrors $M_i$ each provided in a corresponding one of the optical paths extending from the respective laser diodes $LD_i$ to the optical fiber, so as to be (i) distant from a corresponding one of the laser diodes $LD_i$ and from the optical fiber and (ii) between a corresponding one of the collimating lenses $SL_i$ and the optical fiber, each of the mirrors $M_i$ being arranged such that a corresponding one of the optical paths extending from the laser diodes $LD_i$ to the optical fiber is bent at a predetermined angle.

With the above configuration, an optical path from each laser diode $LD_i$ to the optical fiber is bent by the mirror $M_i$ at a predetermined angle. This enables reducing a length of the laser module. Note that the "length" of the laser module refers to one of dimensions of the laser module which one is measured along a direction parallel to a central axis of the optical fiber.

Further, a laser module 1 may be configured such that the laser module 1 further includes a substrate B having a mounting surface S on which the laser diodes $LD_i$, the collimating lenses $SL_i$, and the mirrors $M_i$ are mounted, the mounting surface S including at least n sub-mounting surfaces $SS_i$ provided in a step-like configuration such that respective heights of the sub-mounting surfaces $SS_i$ descend toward the optical fiber OF, on each of the sub-mounting surfaces $SS_i$, a corresponding one of the laser diodes $LD_i$, a corresponding one of the collimating lenses $SL_i$, and a corresponding one of the mirrors $M_i$ being mounted.

This configuration, in which each laser diode $LD_i$, each collimating lens $SL_i$, and each mirror $M_i$ are mounted on a corresponding one of the sub-mounting surfaces $SS_i$ which differ in height, allows laser beams, which have been emitted from the respective laser diodes $LD_i$ and passed through the respective collimating lenses $SL_i$ and whose optical paths have been bent by the respective mirrors $M_i$, to be at respective different heights.

A laser module 1 is a laser module, including: an optical fiber OF; n laser diodes $LD_i$ ($i=1, 2, \ldots, n$) arranged in this order in accordance with a descending order of an optical path length $LO_i$, the optical path length $LO_i$ being a length of an optical path extending from each of the laser diodes $LD_i$ to the optical fiber OF; and n collimating lenses $SL_i$ provided in the respective optical paths so as to be distant from the respective laser diodes $LD_i$ and from the optical fiber. In the laser module 1, when a curvature of each of the collimating lenses $SL_i$ is defined to be a curvature $r_i$, at least one of a curvature $r_i$ of a collimating lens $SL_i$ corresponding to a laser diode $LD_1$ and a curvature $r_n$ of a collimating lens $SL_n$ corresponding to a laser diode $LD_n$ differs from a curvature of each of the other ones of the collimating lenses $SL_i$.

A laser module 1 may have a configuration in which one of the curvature $r_1$ and the curvature $r_n$ differs from a curvature of each of the other ones of the collimating lenses $SL_i$, instead of a configuration in which one of the collimation length $LC_1$ and the collimation length $LC_n$ differs from the certain distance SL. This configuration provides the same effect as a configuration in which one of the collimation length $LC_1$ and the collimation length $LC_n$ differs from the certain distance SL.

Further, a laser module 1 may be configured such that at least the curvature $r_1$ is smaller than the curvature of each of the other ones of the collimating lenses $SL_i$.

With this configuration, in a case where respective optical paths of rays of each laser beam become parallel to one another or diverged after the rays have passed through a corresponding one of the S-axis collimating lenses $SL_i$, it is possible to provide the same effect as a configuration in which at least the S-axis collimating lens $SL_1$ is arranged so as to satisfy $SL < LC_1$.

A laser module 1 is a laser module, including: an optical fiber OF; n laser diodes $LD_i$ ($i=1, 2, \ldots, n$) arranged in this order in accordance with a descending order of an optical path length $LO_i$, the optical path length $LO_i$ being a length of an optical path extending from each of the laser diodes $LD_i$ to the optical fiber OF; and n collimating lenses $SL_i$ provided in the respective optical paths so as to be distant from the respective laser diodes $LD_i$ and from the optical fiber. In the laser module 1, when a size of an emitter included in each of the laser diodes $LD_i$ is defined to be an emitter size $ES_i$, at least one of an emitter size $ES_1$ and an emitter size $ES_n$ differs from an emitter size of each of the other ones of the laser diodes $LD_i$.

A laser module 1 may have a configuration in which one of the emitter size $ES_1$ and the emitter size $ES_n$ differs from a emitter size of each of the other ones of the laser diodes $LD_i$, instead of a configuration in which one of the collimation length $LC_1$ and the collimation length $LC_n$ differs from the certain distance SL. This configuration provides the laser module to provide the same effect as the laser module in which one of the collimation length $LC_1$ and the collimation length $LC_n$ differs from the certain distance SL.

Further, a laser module 1 may be configured such that at least the emitter size $ES_1$ is smaller than the emitter size of each of the other ones of the laser diodes $LD_i$.

With this configuration, in a case where respective optical paths of rays of each laser beam become parallel to one another or diverged after the rays have passed through a corresponding one of the S-axis collimating lenses $SL_i$, it is possible to provide the same effect as a configuration in which at least the S-axis collimating lens $SL_1$ is arranged so as to satisfy $SL<LC_1$.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST 1 laser module
$LD_i$ laser diode
$FL_i$ F-axis collimating lens
$SL_i$ S-axis collimating lens
$M_i$ mirror
FL condenser lens
OF optical fiber
B bottom plate (substrate)
S mounting surface
$SS_i$ sub-mounting surface

The invention claimed is:

1. A laser module, comprising:
an optical fiber;
n laser diodes $LD_i$ (i=1, 2, ..., n) arranged in an order corresponding to a descending order of optical path lengths $LO_i$ of optical paths respectively extending from the laser diodes $LD_i$ to the optical fiber, wherein the laser diodes $LD_i$ respectively emit laser beams $LB_i$; and
n S-axis collimating lenses $SL_i$ respectively disposed in the optical paths to be distant from the respective laser diodes $LD_i$ and from the optical fiber, wherein
each of the laser diodes $LD_i$ and each of the S-axis collimating lenses $SL_i$ constitute a part of n unit optical systems which respectively couple the laser beams $LB_i$ and a laser beam propagated through the optical fiber,
a collimation length $LC_i$ is defined as a distance from each of the laser diodes $LD_i$ to a corresponding one of the S-axis collimating lenses $SL_i$,
the laser module is configured to have either an odd number or an even number of the unit optical systems, such that:
in a case where a total number of the unit optical systems is the odd number, a certain distance SL is defined as a collimation length $LC_i$ of a predetermined unit optical system whose optical path length $LO_i$ is an intermediate value of optical path lengths among the unit optical systems, and
in a case where the total number is the even number, a certain distance SL is defined as a collimation length LCi of a predetermined unit optical system whose optical path length LOi is closest to an intermediate value of optical path lengths among the unit optical systems,
at least one of a collimation length $LC_1$ and a collimation length $LC_n$ differs from the certain distance SL, such that the largest one of incident angles $\beta_i$, at which rays of a laser beam $LB_1$ or laser beam $LB_n$ enter the optical fiber, is reduced,
the collimation length $LC_1$ corresponds to a laser diode $LD_1$ and the collimation length $LC_n$ corresponds to a laser diode $LD_n$,
the certain distance SL is set such that optical paths of rays of a laser beam emitted from each of the laser diodes $LD_i$ included in the predetermined unit optical system are parallel to one another or diverged after the rays have passed through the corresponding one of the S-axis collimating lenses $SL_i$ included in the predetermined unit optical system,
an S-axis collimating lens $SL_1$ is disposed to satisfy $SL<LC_1$,
a laser diode $LD_m$ is defined as a laser diode that is included in a unit optical system whose optical path length $LO_i$ is longer than an optical path length of the predetermined unit optical system and is shorter than the optical path length $LO_1$, and
an S-axis collimating lens $SL_j$ corresponding to a laser diode $LD_j$ ($2 \le j \le m$, $2 \le m \le n-1$) is disposed to satisfy $SL<LC_m \le LC_j<LC_1$.

2. The laser module as set forth in claim 1, wherein an S-axis collimating lens $SL_n$ is disposed to satisfy $LC_n<SL$.

3. The laser module as set forth in claim 2, wherein
a laser diode $LD_1$ is defined as a laser diode that is included in a unit optical system whose optical path length $LO_i$ is shorter than an optical path length of the predetermined unit optical system and is longer than the optical path length $LO_n$, and
an S-axis collimating lens $SL_k$ corresponding to a laser diode $LD_k$ ($1 \le k \le n-1$) is disposed to satisfy $LC_n<LC_k \le LC_1<SL$.

4. The laser module as set forth in claim 1, further comprising:
n mirrors $M_i$ that are respectively disposed in the optical paths extending from the laser diodes $LD_i$ to the optical fiber, wherein
each of the mirrors $M_i$ is (i) distant from a corresponding one of the laser diodes $LD_i$ and from the optical fiber and (ii) disposed between a corresponding one of the S-axis collimating lenses $SL_i$ and the optical fiber, and
each of the mirrors $M_i$ is disposed to bend, at a predetermined angle, a corresponding one of the optical paths extending from the laser diodes $LD_i$ to the optical fiber.

5. The laser module as set forth in claim 4, further comprising:
a substrate that has a mounting surface S on which the laser diodes $LD_i$, the S-axis collimating lenses $SL_i$ and the mirrors $M_i$ are mounted, wherein
the mounting surface S includes n sub-mounting surfaces $SS_i$ having a step-like configuration in which heights of the sub-mounting surfaces $SS_i$ descend toward the optical fiber,
on each of the sub-mounting surfaces $SS_i$ a corresponding one of the laser diodes $LD_i$ a corresponding one of the S-axis collimating lenses $SL_i$ and a corresponding one of the mirrors $M_i$ are mounted.

6. A laser module, comprising:
an optical fiber;
n laser diodes $LD_i$ (i=1, 2, ..., n) arranged in an order corresponding to a descending order of optical path lengths $LO_i$ of optical paths respectively extending from the laser diodes $LD_i$ to the optical fiber, wherein the laser diodes $LD_i$ respectively emit laser beams $LB_i$; and
n S-axis collimating lenses $SL_i$ respectively disposed in the optical paths to be distant from the respective laser diodes $LD_i$ and from the optical fiber, wherein
each of the laser diodes $LD_i$ and each of the S-axis collimating lenses $SL_i$ constitute a part of n unit optical systems which respectively couple the laser beams $LB_i$ and a laser beam propagated through the optical fiber,
a collimation length $LC_i$ is defined as a distance from each of the laser diodes $LD_i$ to a corresponding one of the S-axis collimating lenses $SL_i$,
the laser module is configured to have either an odd number or an even number of the unit optical systems, such that:
  in a case where a total number of the unit optical systems is the odd number, a certain distance SL is defined as a collimation length $LC_i$ of a predetermined unit optical system whose optical path length $LO_i$ is an intermediate value of optical path lengths among the unit optical systems, and
  in a case where the total number is the even number, a certain distance SL is defined as a collimation length $LC_i$ of a predetermined unit optical system whose optical path length $LO_i$ is closest to an intermediate value of optical path lengths among the unit optical systems,
at least one of a collimation length $LC_1$ and a collimation length $LC_n$ differs from the certain distance SL, such that the largest one of incident angles $β_i$, at which rays of a laser beam $LB_1$ or laser beam $LB_n$ enter the optical fiber, is reduced,
the collimation length $LC_1$ corresponds to a laser diode $LD_1$ and the collimation length $LC_n$ corresponds to a laser diode $LD_n$,
the certain distance SL is set such that optical paths of rays of a laser beam emitted from each of the laser diodes $LD_i$ included in the predetermined unit optical system are converged after the rays have passed through the corresponding one of the S-axis collimating lenses $SL_i$ included in the predetermined unit optical system,
an S-axis collimating lens $SL_n$ is disposed to satisfy $SL<LC_n$,
a laser diode $LD_m$ is defined as a laser diode that is included in a unit optical system whose optical path length $LO_i$ is longer than an optical path length of the predetermined unit optical system and is shorter than the optical path length $LO_n$, and
an S-axis collimating lens $SL_j$ corresponding to a laser diode $LD_j$ (m≤j≤n-1, 2≤m≤n-1) is disposed to satisfy $SL<LC_m≤LC_j<LC_n$.

7. The laser module as set forth in claim 6, wherein an S-axis collimating lens $SL_1$ is disposed to satisfy $LC_1<SL$.

8. The laser module as set forth in claim 7, wherein
a laser diode $LD_1$ is defined as a laser diode that is included in a unit optical system whose optical path length $LO_i$ is longer than an optical path length of the predetermined unit optical system and is shorter than the optical path length $LO_1$, and
an S-axis collimating lens $SL_k$ corresponding to a laser diode $LD_k$ (2≤k≤1) is disposed to satisfy $LC1<LCk≤LC1<SL$.

9. The laser module as set forth in claim 6, further comprising:
n mirrors $M_i$ that are respectively disposed in the optical paths extending from the laser diodes $LD_i$ to the optical fiber, wherein
each of the mirrors $M_i$ is (i) distant from a corresponding one of the laser diodes $LD_i$ and from the optical fiber and (ii) disposed between a corresponding one of the S-axis collimating lenses $SL_i$ and the optical fiber, and
each of the mirrors $M_i$ is disposed to bend, at a predetermined angle, a corresponding one of the optical paths extending from the laser diodes $LD_i$ to the optical fiber.

10. The laser module as set forth in claim 9, further comprising:
a substrate that has a mounting surface S on which the laser diodes $LD_i$, the S-axis collimating lenses $SL_i$, and the mirrors $M_i$ are mounted, wherein
the mounting surface S includes n sub-mounting surfaces $SS_i$ having a step-like configuration in which heights of the sub-mounting surfaces $SS_i$ descend toward the optical fiber,
on each of the sub-mounting surfaces $SS_i$ a corresponding one of the laser diodes $LD_i$, a corresponding one of the S-axis collimating lenses $SL_i$ and a corresponding one of the mirrors $M_i$ are mounted.

* * * * *

UNITED STATES PATENT AND TRADEMARK OFFICE
CERTIFICATE OF CORRECTION

| | |
|---|---|
| PATENT NO. | : 11,675,144 B2 |
| APPLICATION NO. | : 16/978097 |
| DATED | : June 13, 2023 |
| INVENTOR(S) | : Masahiro Uchiyama |

It is certified that error appears in the above-identified patent and that said Letters Patent is hereby corrected as shown below:

In the Specification

At Column 2, Line number 52, "n=4" should read -- i=4 --;

At Column 2, Line numbers 55 and 58, "n=1" should read -- i=1 --.

In the Claims

At Column 17, Claim number 1, Line number 49, "$LD_i$, respectively" should read -- $LD_i$ respectively --;

At Column 18, Claim number 5, Line number 67, "$LD_i$ a" should read -- $LD_i$, a --;

At Column 19, Claim number 5, Line number 1, "$SL_i$ and" should read -- $SL_i$, and --;

At Column 20, Claim number 10, Line number 47, "$SL_i$ and" should read -- $SL_i$, and --.

Signed and Sealed this
Eighth Day of August, 2023

Katherine Kelly Vidal
*Director of the United States Patent and Trademark Office*